(12) United States Patent
Honarparvar et al.

(10) Patent No.: US 10,938,405 B1
(45) Date of Patent: Mar. 2, 2021

(54) APPARATUS AND METHODS FOR CHARACTERIZATION OF HIGH FREQUENCY AND HIGH DATA RATE SIGNALS

(71) Applicant: Ciena Corporation, Hanover, MD (US)

(72) Inventors: Mohammad Honarparvar, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/822,120

(22) Filed: Mar. 18, 2020

(51) Int. Cl.
*H03M 3/00* (2006.01)
*H03M 1/66* (2006.01)
*H03M 1/12* (2006.01)
*H03M 1/10* (2006.01)
*H03M 1/06* (2006.01)

(52) U.S. Cl.
CPC .......... *H03M 1/661* (2013.01); *H03M 3/494* (2013.01); *H03M 1/06* (2013.01); *H03M 1/1009* (2013.01); *H03M 1/12* (2013.01); *H03M 3/30* (2013.01)

(58) Field of Classification Search
CPC ............ H03M 3/30; H03M 1/12; H03M 1/06; H03M 1/1009

USPC ..................... 341/143, 155, 120, 126; 31/118
See application file for complete search history.

(56) References Cited

U.S. PATENT DOCUMENTS

2013/0214952 A1* 8/2013 Makinwa .............. H03M 1/144
341/143

* cited by examiner

*Primary Examiner* — Joseph J Lauture
(74) *Attorney, Agent, or Firm* — Young Basile Hanlon & MacFarlane, P.C.

(57) ABSTRACT

Described herein are apparatus and methods for low speed characterization of a high-speed signal. A circuit includes a sub-sampling circuit configured to sub-sample a high-speed signal received from a device, a reconstruction loop circuit configured to reconstruct a low-speed signal from the sub-sampled high-speed signal, a low pass filter configured to filter the reconstructed low-speed signal, a discrete time low pass filter configured to mitigate skew rate requirements of the filtered low-speed signal for a digitization circuit, a continuous time low pass filter configured to smooth the skew rate mitigated low-speed signal and the digitization circuit is configured to generate a digital representation of the smoothed low-speed signal for characterization by a characterization device, and shape a noise associated with the smoothed low-speed signal outside a frequency range of interest of the smoothed low-speed signal.

20 Claims, 11 Drawing Sheets

APPARATUS AND METHODS FOR CHARACTERIZATION OF HIGH FREQUENCY AND HIGH DATA RATE SIGNALS

TECHNICAL FIELD

This disclosure relates to digital-to-analog converters (DACs). More specifically, this disclosure relates to characterization of signals output from the high-speed DACs.

BACKGROUND

Modern optical systems increasingly rely on digital signal processor (DSP) Complementary Metal Oxide Semiconductor (CMOS) application-specific integrated circuit (ASICs) for reliable data transmission. These systems use digital-to-analog converters (DACs) to convert digital values to analog signals, where the DACs operate with data rates at and above 100 Gb/s. These high data rates impose stringent requirements on the test and characterization of the analog signals. For example, for an ultra-high-speed DAC with a bandwidth of, for example, 50 GHz, an analog-to-digital (ADC) with a sampling frequency of at least 100 GHz is needed to characterize the output of the DAC. Notwithstanding that the design of such a high-speed ADC is a challenge, the power consumed by such an ADC is not negligible and integration of such an ADC with the high-speed DAC aggravates the situation. Automated Test Equipment (ATE) cannot cope with such requirements.

Conventional techniques for characterization use successive approximation register (SAR) logic which includes a large current steering DAC to estimate the high-speed signal. As a result, these techniques are power hungry and occupy a large footprint on the chip. In addition, the SAR logic is implemented off-chip as data processing requires tremendous processor capacity. These techniques do not provide a high-resolution measurements since the SAR algorithm is limited to 10-bits and the accuracy of the system is mostly dependent on the accuracy and linearity of the DAC. Moreover, these techniques do not capture characterize the DAC in terms of effective number of bits (ENOB). These techniques have been mostly used on the receiver side and they mostly determine 1-D or 2-D eye opening patterns.

SUMMARY

Described herein are apparatus and methods for low speed characterization of a high-speed signal.

In implementations, a circuit includes a sub-sampling circuit configured to sub-sample a high-speed signal received from a device, a reconstruction loop circuit configured to reconstruct a low-speed signal from the sub-sampled high-speed signal, a low pass filter configured to filter the reconstructed low-speed signal, a discrete time low pass filter configured to mitigate skew rate requirements of the filtered low-speed signal for a digitization circuit, a continuous time low pass filter configured to smooth the skew rate mitigated low-speed signal and the digitization circuit is configured to generate a digital representation of the smoothed low-speed signal for characterization by a characterization device, and shape a noise associated with the smoothed low-speed signal outside a frequency range of interest of the smoothed low-speed signal.

In implementations, a low speed system for high-speed signal characterization, the system including a low speed circuit and a characterization device. The low speed circuit includes a sub-sampler configured to down-sample a signal with a first speed received from a device, a reconstruction circuit configured to reconstruct a signal with a second speed from the sub-sampled signal, wherein the second speed is a defined factor lower than the first speed, a low pass filter configured to filter the reconstructed signal; a discrete time filter configured to allay skew rate requirements for a digitizer, the digitizer is configured to digitize a filtered signal, and noise-shape noise outside of a frequency range of interest of the filtered signal. The characterization device configured to characterize the digitized signal from the low speed circuit, and configure the device based on characterization results.

In implementations, a method for low speed characterization of a high-speed signal, the method including sub-sampling a high-speed signal received from a device, reconstructing a low-speed signal from the sub-sampled signal using a comparator-low pass filter loop and a low pass filter, filtering the filtered reconstructed low-speed signal with a discrete time low pass filter to alleviate skew rate considerations, smoothing the filtered low-speed signal with a continuous time low pass filter, digitizing the smoothed low-speed signal, wherein noise is noise-shaped outside a frequency range of interest, characterizing the digitized low-speed signal, and configuring the device based on characterization results of the device.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
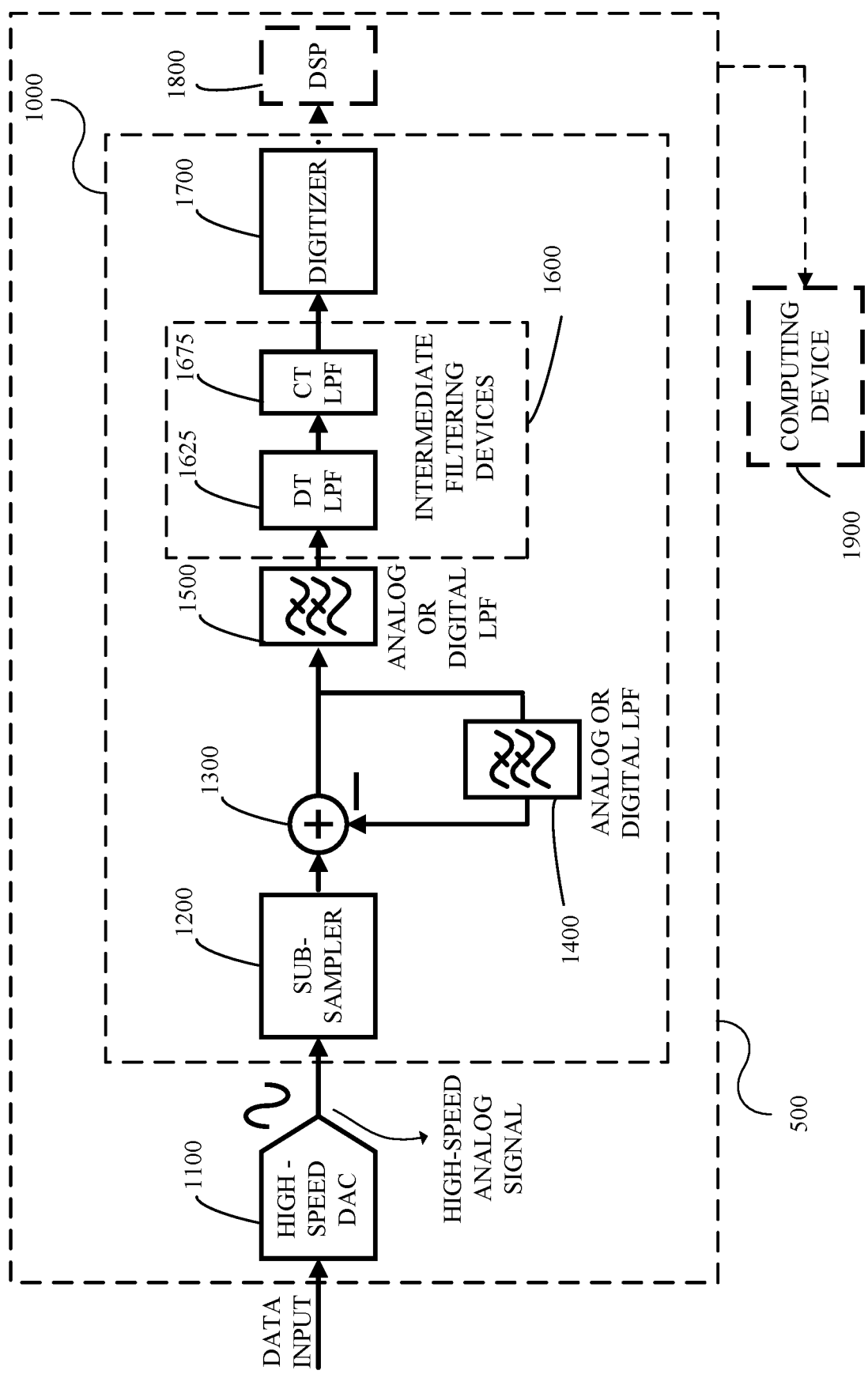
FIG. 1 is a block diagram of an example of a low speed circuit in accordance with embodiments of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Conventional characterization techniques and ATE fail to provide an on-chip solution to characterize the DAC in terms of effective number of bits (ENOB s) while occupying a small footprint and consuming less power. Design-for-test (DFT) methods overcome the ATE limitations and provide remarkable improvements in the repeatability of the measurements on the device under test (DUT).

Described herein are apparatus, device, circuit, system, and methods for characterization of high-frequency signals and high data rate signals (collectively "high-speed signals") which are output, for example, from high-speed DACs. A low speed architected device is disclosed which provides an accurate method for characterizing the high-speed signal by capturing or determining the ENOBs of the high-speed signal. The accuracy is provided, in part, by noise-shaping or pushing the noise associated with the high-speed signal outside of the desired frequency band.

In implementations, the high-speed signal is sub-sampled or down sampled by a given factor based, in part, on the frequency of the high-speed signal. In an illustrative example, the high-speed signal is sub-sampled or down sampled by a factor of 10, 20, or the like. The sub-sampled signal is processed through a comparator and a low pass filter in a feedback loop to reconstruct the high-speed signal at the lower frequency. The output of the comparator is passed through a low pass filter, which is similar to the low pass filter in the feedback loop. In implementations, the two low pass filters are similar in terms of the range of low frequencies passed by the filter, the cut-off frequency, and like operating characteristics, Prior to digitization of the signal, the output of the low pass filter is processed through a discrete time low pass filter and a continuous time low pass filter to mitigate the slew rate requirements imposed by the low pass filter. The output of a digitizer is fed to an on-chip processor or off-chip computing device for characterization. The results of the characterization can be used to configure the high-speed DAC.

In implementations, the low speed architected device can be multiplexed for use with multiple DACs on the chip or in the system. In implementations, the low speed architected device can be multiplexed for use with a multi-channel DAC. Consequently, the low speed architected device makes efficient use of chip or silicon area.

A variety of simple blocks or circuits such as RC filters and/or digital filters can be used in implementing the low speed architected device. The low speed architected device can be implemented in a scaling-friendly digital environment. In this case, the filters can be implemented using digital standard cells and the oversampled ADC or noise shaping data converter can be realized by inverters. In either case, the low speed architected device has low power requirements and occupies a small footprint relative to conventional techniques. In addition, the design results in a reduced bill of materials.

The description uses a high-speed DAC and a high-speed signal for purposes of illustration. The description is applicable to a device which generates an analog signal with a first frequency or rate which is processed through a low speed circuit to generate an analog signal with a second rate or frequency and then generate a digitized version of the analog signal with the second rate or frequency where the second rate or frequency is a defined factor lower than the first rate or frequency.

FIG. 1 is a block diagram of an example of a low speed circuit 1000 in accordance with embodiments of this disclosure. The input to the low speed circuit 1000 is a high-speed signal from a high-speed DAC 1100 which has processed a data input. The low speed circuit 1000 can include a sub-sampler or sub-sampling circuit 1200 having an output connected to one input of a comparator 1300, where a second input of the comparator 1300 is connected to an output of a low pass filter 1400 provided in a comparator feedback loop. In implementations, the low pass filter 1400 can be an analog device, a digital device, and/or combinations thereof. In implementations, the low pass filter 1400 can be an analog RC low pass filter, a digital integrator, a counter, and the like. An output of the comparator 1300 is connected to the input of the low pass filter 1400 and a low pass filter 1500, which can be similar to the low pass filter 1400. In implementations, the low pass filter 1500 can be an analog device, a digital device, and/or combinations thereof. In implementations, the low pass filter 1500 can be an analog RC low pass filter, a digital integrator, a counter, and the like.

The output of the low pass filter 1500 is connected to intermediate filtering devices 1600, which can include a discrete time low pass filter 1625 connected to a continuous time low pass filter 1675. In implementations, the discrete time low pass filter 1625 can be a switched capacitor low pass filter. In implementations, the discrete time low pass filter 1625 can be a first order device, a second order device, and like. In implementations, the continuous time low pass filter 1675 can be a first order device, a second order device, and like. The output of the continuous time low pass filter 1675 is connected to an input of a digitizer or digitization circuit 1700. An output of the digitizer 1700 is fed to an on-chip processor such as a digital signal processor (DSP) 1800 or an off-chip computing device 1900 for characterization. In implementations, the high-speed DAC 1100, the sub-sampler 1200, the comparator 1300, the low pass filter 1400, the low pass filter 1500, the discrete time low pass filter 1625, the continuous time low pass filter 1675, and the digitizer 1700 are devices or circuits which are on an on-chip device 500. In implementations, one or more of the sub-sampler 1200, the comparator 1300, the low pass filter 1400, the low pass filter 1500, the discrete time low pass filter 1625, the continuous time low pass filter 1675, and the digitizer 1700 can be differential devices or circuits.

The low speed circuit 1000, the on-chip device 500, and the devices comprising therein can include other elements which may be desirable or necessary to implement the devices, systems, compositions and methods described herein. However, because such elements and steps are well known in the art, and because they do not facilitate a better understanding of the disclosed embodiments, a discussion of such elements and steps may not be provided herein.

Operationally, the high-speed DAC 1100 generates a high-speed signal from a data input. The high-speed signal is sub-sampled by the sub-sampler 1200 and then fed to the comparator 1300. The output of the comparator 1300 is reconstructed by the low pass filter 1400. The reconstructed signal is then fed back to the comparator 1300. The output of the comparator 1300 is also filtered by the low pass filter 1500. The resulting signal can impose stringent requirements in terms of slew-rate (SR) on the following stages, for example, the digitizer 1700. Accordingly, the discrete time low pass filter 1625 and the continuous time low pass filter 1675 are used to process the output of the low pass filter 1500. In particular, the output of the discrete time low pass filter 1625 is then post processed with the continuous time low pass filter 1675. The output of the continuous time low pass filter 1675 is digitized by the digitizer 1700. The output of the digitizer 1700 is characterized by the DSP 1800 in an on-chip or real-time configuration or by the computing device 1900 in an off-chip configuration. The characterization can be used to configure the DAC 1100.

Figure 2:
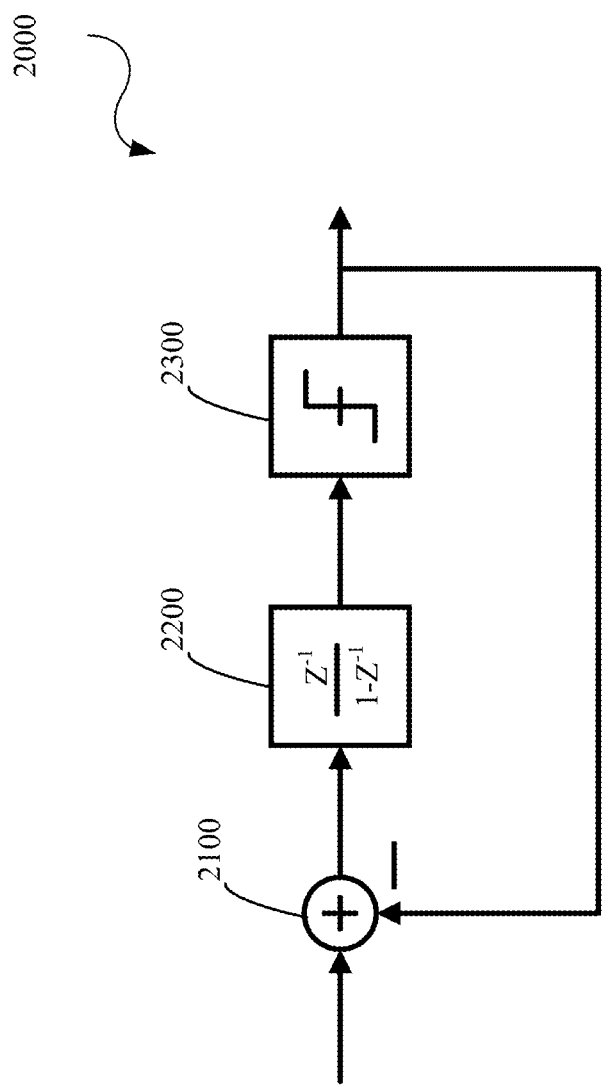
FIG. 2 is a block diagram of an example of a digitizer for a low speed circuit in accordance with embodiments of this disclosure.

FIG. 2 is a block diagram of an example of a digitizer 2000 for a low speed circuit in accordance with embodiments of this disclosure. In implementations, the digitizer 2000 is a first order sigma delta analog-to-digital converter (ADC). The digitizer 2000 can include a summation circuit 2100 having a first input connected to an output of the continuous time low pass filter 1675, for example. The output of the summation circuit 2100 is processed through a loop filter function circuit 2200, which can be implemented as an integrator with delay. The output of the loop filter function circuit 2200 is input to a comparator 2300, which can perform as a quantizer. The output of the comparator 2300 is connected as the second input to the summation circuit 2100 in a feedback path. The output of the comparator 2300 is also the output of the digitizer 2000.

Figure 3:
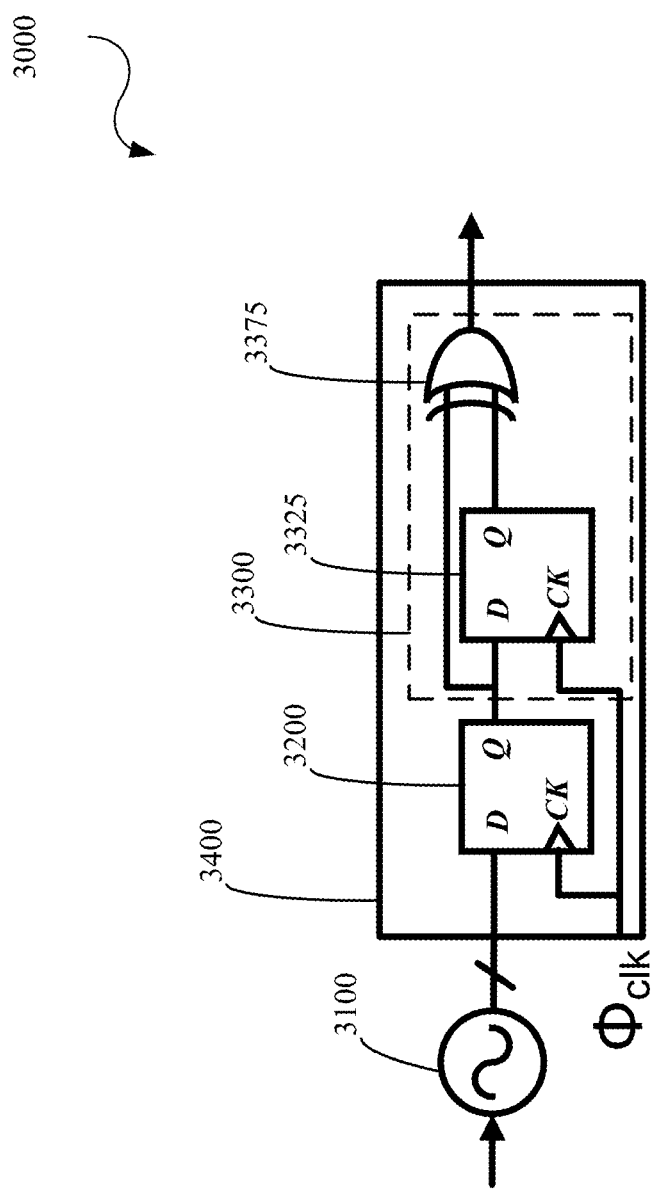
FIG. 3 is a block diagram of an example of a digitizer for a low speed circuit in accordance with embodiments of this disclosure.

FIG. 3 is a block diagram of an example of a digitizer 3000 for a low speed circuit in accordance with embodiments of this disclosure. The digitizer 3000 can include a voltage-controlled oscillator (VCO) 3100 performs as a voltage to time converter to generate a time domain output.

A first D flip-flop (DFF) 3200 quantizes the time domain output and is timed using an input clock ($\varnothing_{clk}$). The quantized time domain output is processed by a loop filter function circuit 3300 to implement a $(1-z^{-1})$ transfer function. The loop filter function circuit 3300 can be implemented by a second DFF 3325 (also timed using an input clock ($\varnothing_{clk}$)) and a logical exclusive OR gate 3375. The first DFF 3200, the second DFF 3300, and the logical exclusive OR gate 3375 collectively perform as a frequency to digital converter (FDC) 3400 since the input of the FDC 3400 is a time (or frequency) domain input and the output of the FDC 3400 is a digital representation of the time (or frequency) domain input.

Figure 4:
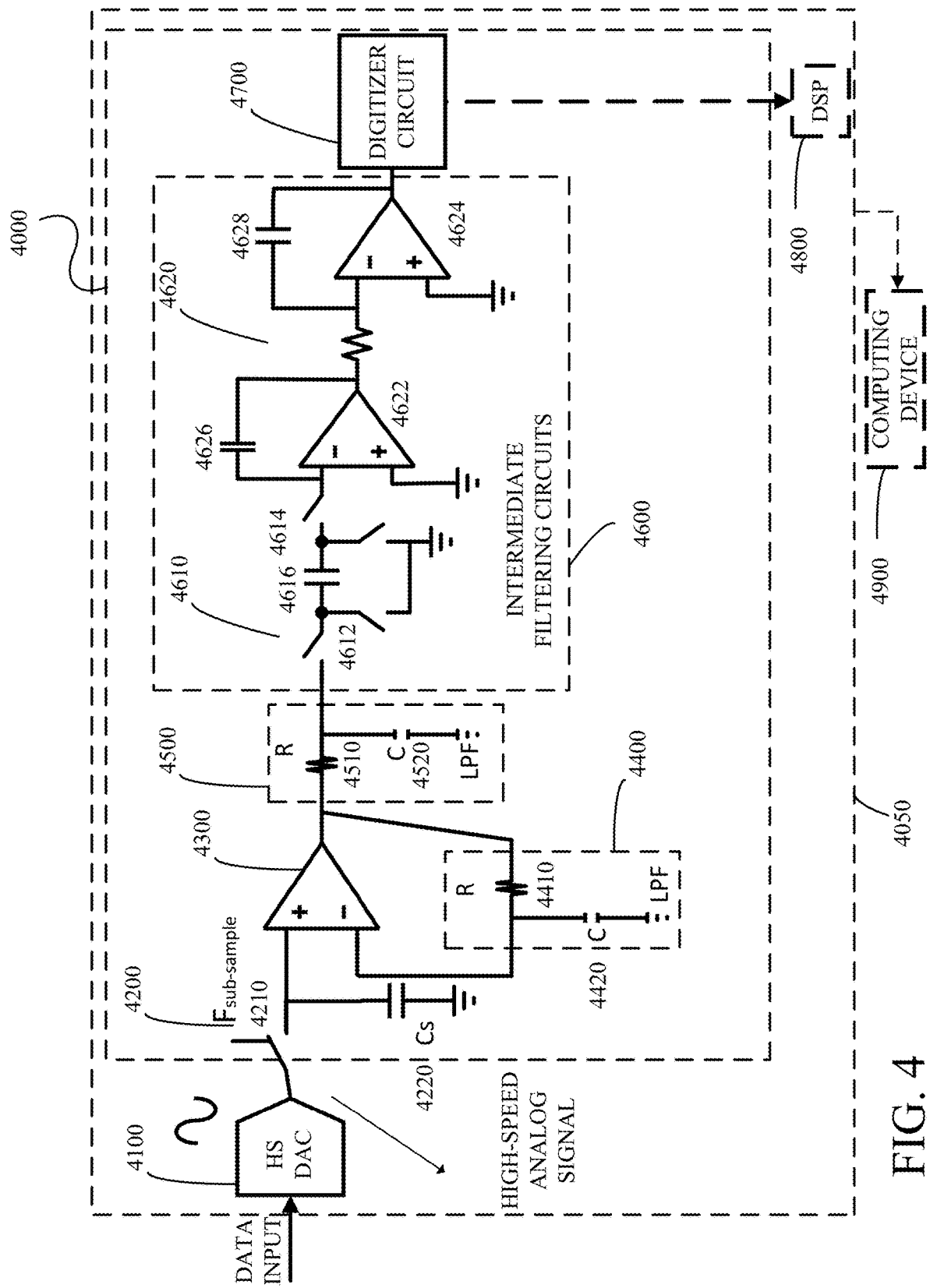
FIG. 4 is a block diagram of an example of a low speed circuit in accordance with embodiments of this disclosure.

FIG. 4 is a block diagram of an example of a low speed circuit 4000 in accordance with embodiments of this disclosure. The input to the low speed circuit 4000 is a high-speed signal from a high-speed DAC 4100 which has processed a data input. The low speed circuit 4000 can include a sample and hold circuit 4200 having an output connected to one input an operational amplifier 4300. The sample and hold circuit 4200 can be implemented by a switch 4210 and a capacitor 4220. A second input of the operational amplifier 4300 is connected to an output of a low pass filter 4400 provided in a comparator feedback loop, where the low pass filter 4400 can be implemented by resistor 4410 and a capacitor 4420. An output of the operational amplifier 4300 is connected to the input of the low pass filter 4400 and an input of a low pass filter 4500, where the low pass filter 4500 can be implemented by resistor 4510 and a capacitor 4520.

The output of the low pass filter 4500 is connected to intermediate filtering circuits 4600. The intermediate filtering circuits 4600 can include a switched capacitor circuit 4610 which includes a pair of switches 4612 and 4614 for charging and discharging a capacitor 4616. The output of the switched capacitor circuit 4610 is connected to a first input of a first operational amplifier 4622 in a cascaded connection with a second operational amplifier 4624 of a continuous time filter circuit 4620, where an output of the first operational amplifier 4622 is connected to a first input of the second operational amplifier 4624. A capacitor 4626 and 4628 are connected between the output and the first input of each of the first operational amplifier 4622 and the second operational amplifier 4624, respectively. The second input of each of the first operational amplifier 4622 and the second operational amplifier 4624 are tied to ground. The output of the second operational amplifier 4624 is connected to an input of a digitizer circuit 4700. An output of the digitizer circuit is fed to an on-chip processor such as a digital signal processor (DSP) 4800 or an off-chip computing device 4900 for characterization. In implementations, the low speed circuit 4000 can be implemented on an on-chip device 4050. In implementations, one or more of the circuits in the low speed circuit 4000 can be differential circuits.

The low speed circuit 4000, the on-chip device 4050, and the circuits comprising therein can include other elements which may be desirable or necessary to implement the devices, systems, compositions and methods described herein. However, because such elements and steps are well known in the art, and because they do not facilitate a better understanding of the disclosed embodiments, a discussion of such elements and steps may not be provided herein.

Operationally, the high-speed DAC 4100 generates a high-speed signal from a data input. The high-speed signal is sub-sampled by the sample and hold 4200 where a buffer is not shown here for ease of understanding. The output of the sample and hold 4200 is the fed into a comparator as implemented by the operational amplifier 4300. The output of the operational amplifier 4300 is fed back to its input through the low pass filter 4400. The output of the operational amplifier 4300 is also filtered through the low pass filter 4500. The output of the low pass filter 4500 cannot be directly injected to the digitizer circuit 4700 because it imposes stringent requirements on the digitizer circuit 4700. In other words, if the output of the low pass filter 4500 were to be fed into the digitizer circuit 4700, active components such as operational amplifiers would need an impractically high slew-rate. To avoid this, the output of the low pass filter 4500 is filtered by the switched capacitor circuit 4610. Although a first order switched capacitor circuit 4610 is illustrated, the order of the switched capacitor circuit 4610 is variable. The output of the switched capacitor circuit 4610 is then re-filtered by the continuous time filter circuit 4620. This results in a smooth signal being input into the digitizer circuit 4700. The digitizer 4700 effectively removes the noise from the signal. That is, the noise is noise-shaped out of the frequency range of interest. The output of the digitizer circuit 4700 is characterized by the DSP 4800 in an on-chip or real-time configuration or by the computing device 4900 in an off-chip configuration. The characterization can be used to configure the DAC 4100.

Figure 5:
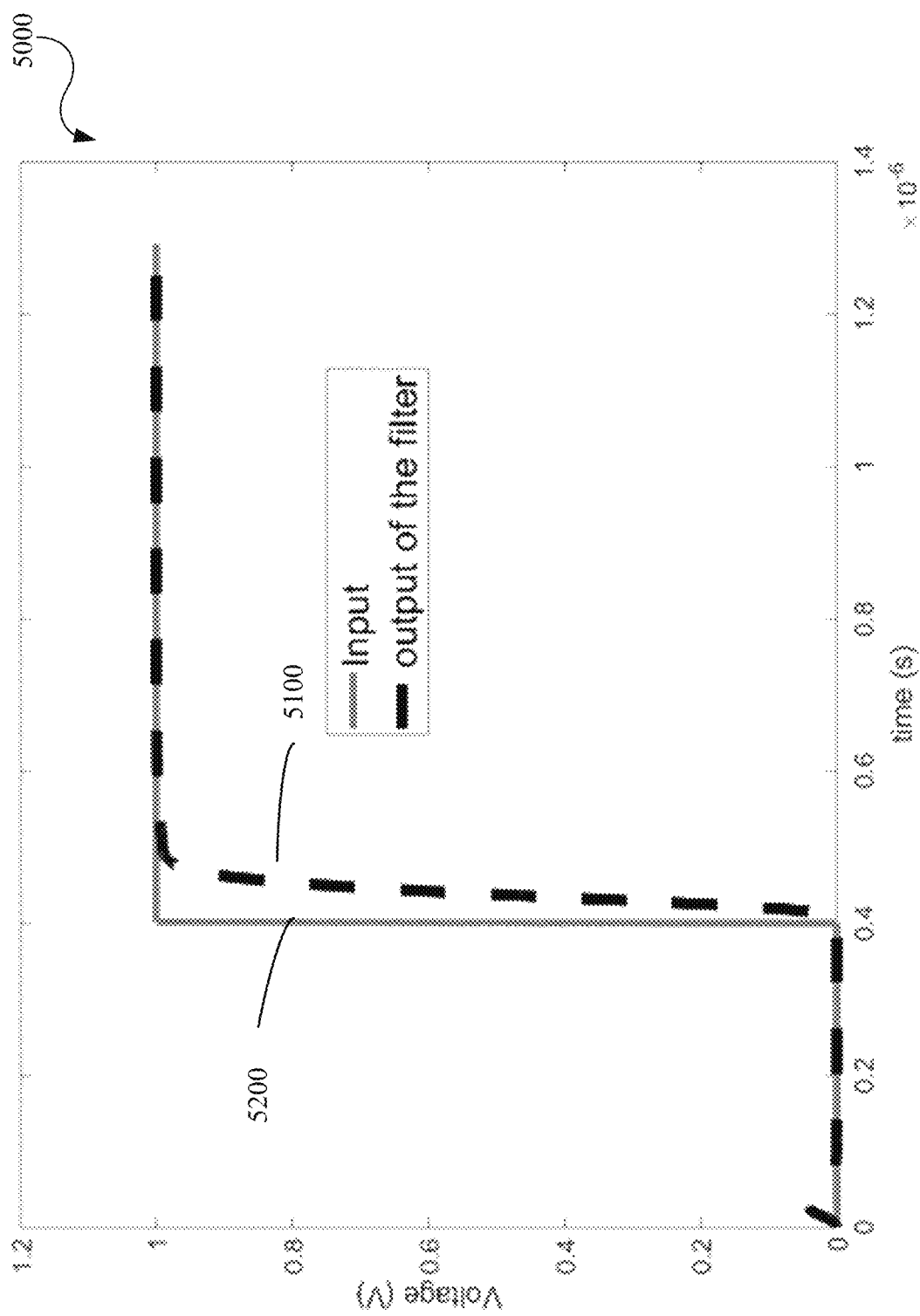
FIG. 5 is a graph of an input and output signal step comparison from a low speed circuit in accordance with embodiments of this disclosure.

FIG. 5 is a graph 5000 of an input and output signal step comparison from a low speed circuit in accordance with embodiments of this disclosure. The graph 5000 illustrates a step response comparison between an output 5100 of the low pass filter 4500, for example, and an input 5200 to the low speed circuit 4000. As shown, the output 5100 substantially tracks the input 5200.

Figure 6:
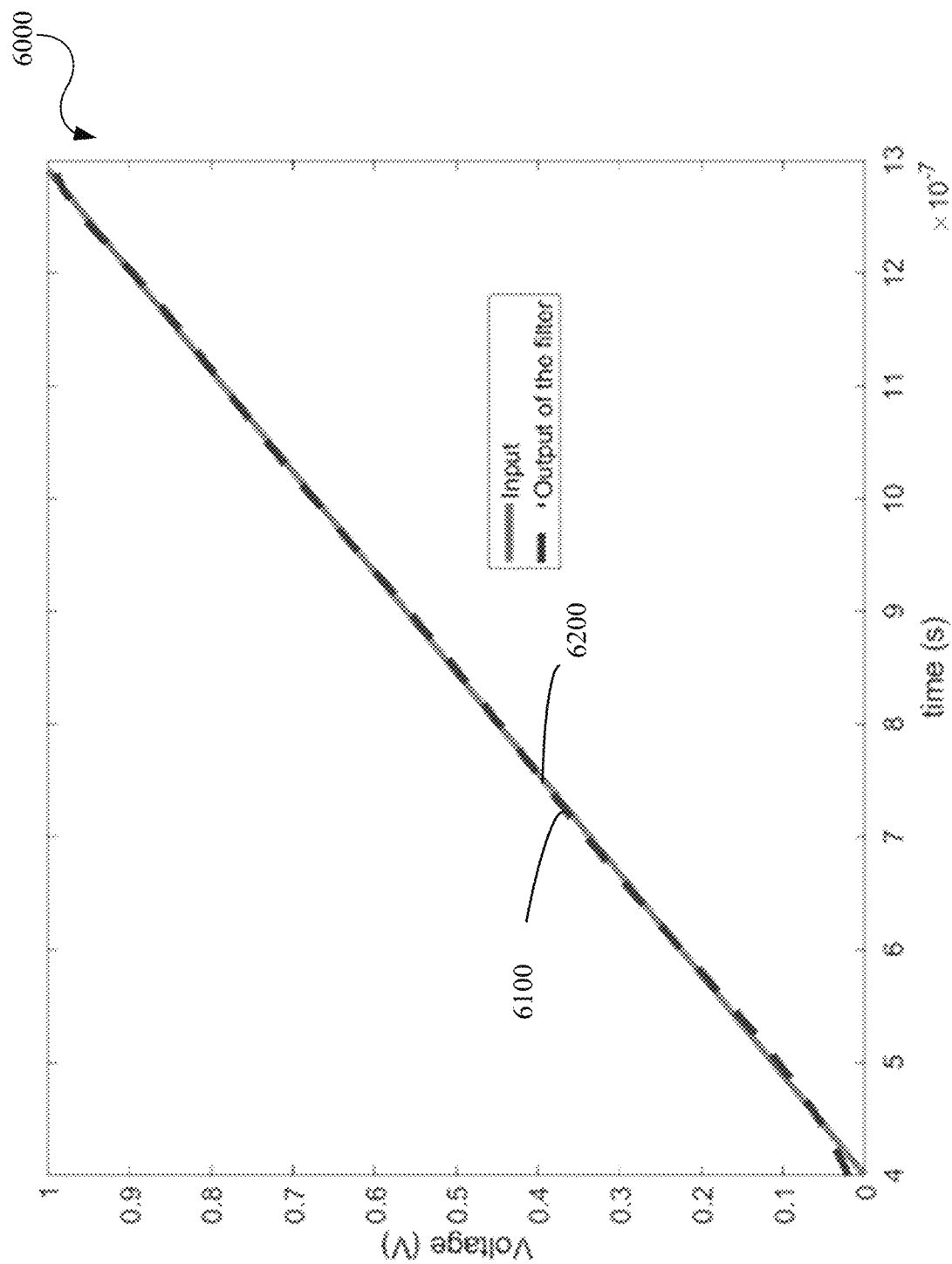
FIG. 6 is a graph of an input and output signal ramp comparison from a low speed circuit in accordance with embodiments of this disclosure.

FIG. 6 is a graph 6000 of an input and output signal ramp comparison from a low speed circuit in accordance with embodiments of this disclosure. The graph 6000 illustrates a ramp response comparison between an output 6100 of the low pass filter 4500, for example, and an input 6200 to the low speed circuit 4000. As shown, the output 6100 substantially tracks the input 6200.

Figure 7:
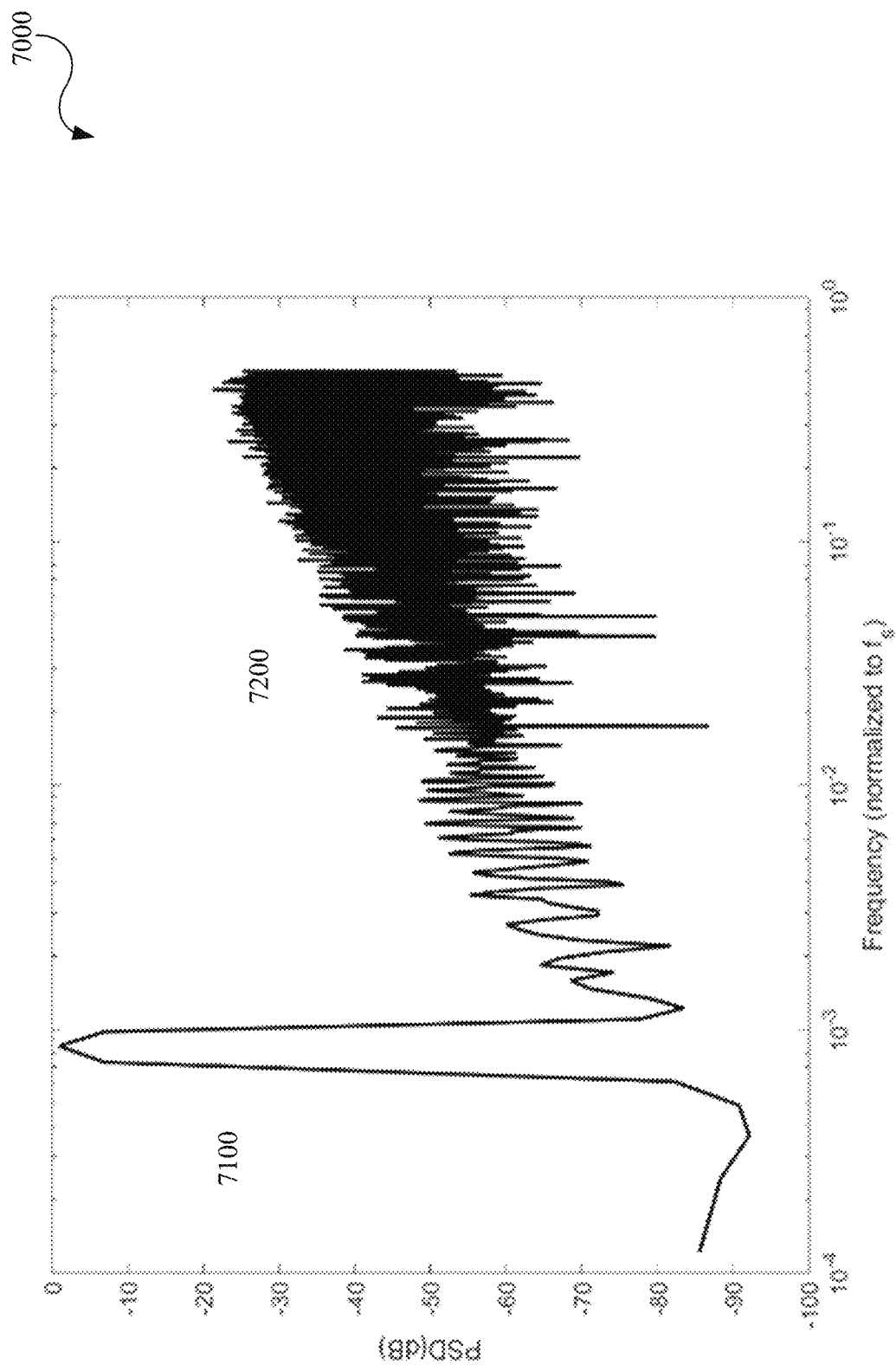
FIG. 7 is a graph of an output signal from a low speed circuit in accordance with embodiments of this disclosure.

FIG. 7 is a graph 7000 of an output signal from a low speed circuit in accordance with embodiments of this disclosure. The graph 7000 illustrates that a noise 7100 is shaped out of the frequency band of interest of a signal 7200. Consequently, not only does a digitizer circuit 4700, for example, capture the ENOB of the DAC 4100 but it mitigates the effect of the noise components.

Figure 8:
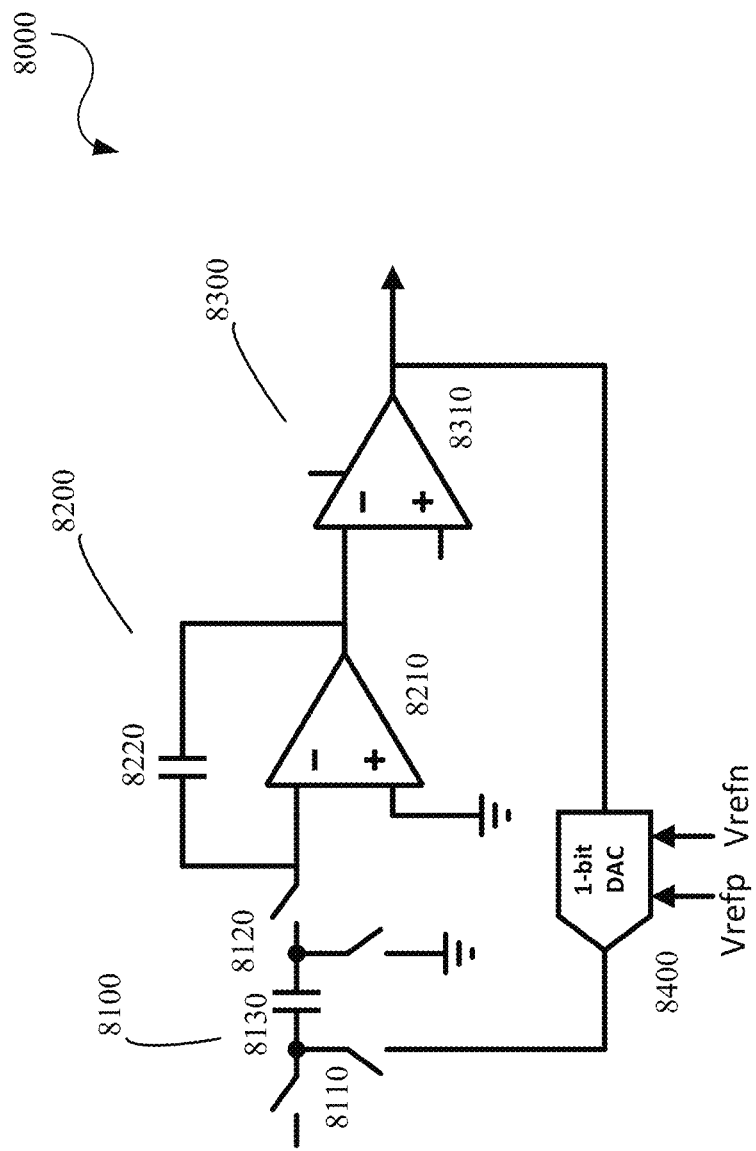
FIG. 8 is a block diagram of an example of a digitizer for a low speed circuit in accordance with embodiments of this disclosure.

FIG. 8 is a block diagram of an example of a digitizer circuit 8000 for a low speed circuit in accordance with embodiments of this disclosure. An output of a continuous time filter circuit 4620, for example, is an input to the digitizer circuit 8000. The digitizer circuit 8000 can include a switched capacitor or sampling capacitor circuit 8100 for receiving the input. The switched capacitor circuit 8100 can include a pair of switches 8110 and 8120 which charge and discharge a capacitor 8130. The output of the switched capacitor circuit 8100 is fed to an integrator 8200 which is implemented by an operational amplifier 8210 having a first input connected to an output of the switched capacitor circuit 8100 and also connected to an output of the operational amplifier 8210 via a capacitor 8220 in a feedback path. The output of the operational amplifier 8210 is fed to a comparator 8300 which is implemented by an operational amplifier 8310 having a first input connected to the output of the operational amplifier and an output of the operational amplifier 8310 connected to the switched capacitor circuit 8100 via a DAC 8400 in a feedback path.

Figure 9:
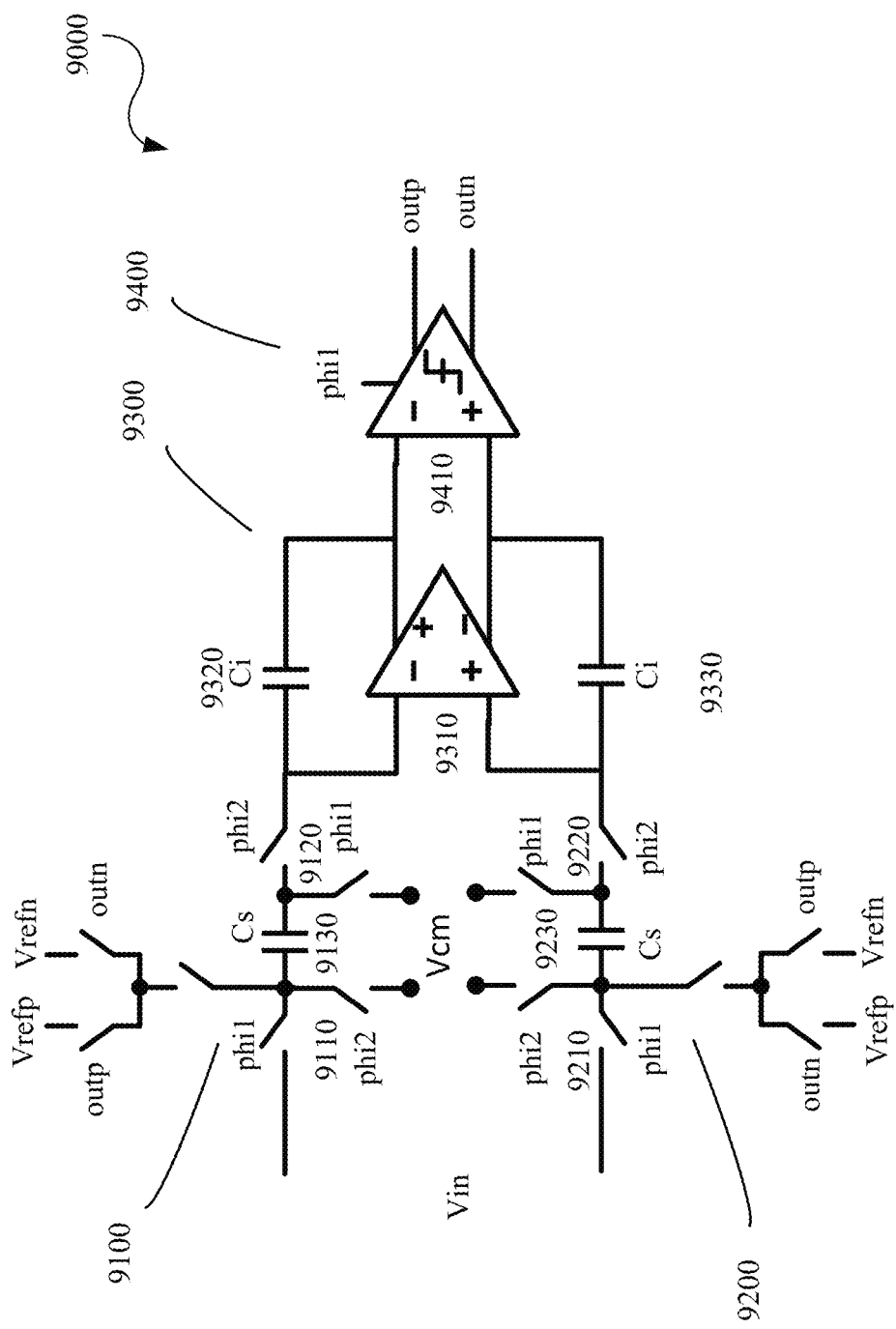
FIG. 9 is a block diagram of an example of a differential digitizer for a low speed circuit in accordance with embodiments of this disclosure.

FIG. 9 is a block diagram of an example of a differential digitizer 9000 for a low speed circuit in accordance with embodiments of this disclosure. In the illustration, $V_{in}$ is the differential input, $V_{cm}$ is a common mode voltage, phi1 and phi2 are non-overlapping clock signals generated from a master clock, and $out_p$ and $out_n$ are the outputs of the differential digitizer 9000.

An output of a continuous time filter circuit 4620, for example, is an input to the differential digitizer 9000. The differential digitizer 9000 can include a first switched capacitor or sampling capacitor circuit 9100 and a second switched capacitor or sampling capacitor circuit 9200 for receiving the input. The first switched capacitor circuit 9100 can include a pair of switches 9110 and 9120 which charge and discharge a sampling capacitor ($C_s$) 9130. The output of the first switched capacitor circuit 9100 is connected to a first input of an integrator 9300. The second switched capacitor circuit 9200 can include a pair of switches 9210 and 9220 which charge and discharge a $C_s$ 9230. The output of the second switched capacitor circuit 9200 is connected to a second input of the integrator 9300.

The integrator 9300 can be implemented by an operational amplifier 9310 having the first input also connected to a first output of the operational amplifier 9310 via a first integrating capacitor ($C_i$) 9320 in a feedback path and having the second input also connected to a second output of the operational amplifier 9310 via a second $C_i$ 9330 in a feedback path. The first output of the operational amplifier 9310 and the second output of the operational amplifier 9310 are fed to a comparator 9400. The comparator 9400 can be implemented by an operational amplifier 9410 having a first input connected to the first output of the operational amplifier 9310 and a second input connected to the second output of the operational amplifier 9310. A first output of the operational amplifier 9410 is connected to the first switched capacitor circuit 9110 via a feedback path and the second output of the operational amplifier 9410 is connected to the second switched capacitor circuit 9200 via a feedback path.

Figure 10:
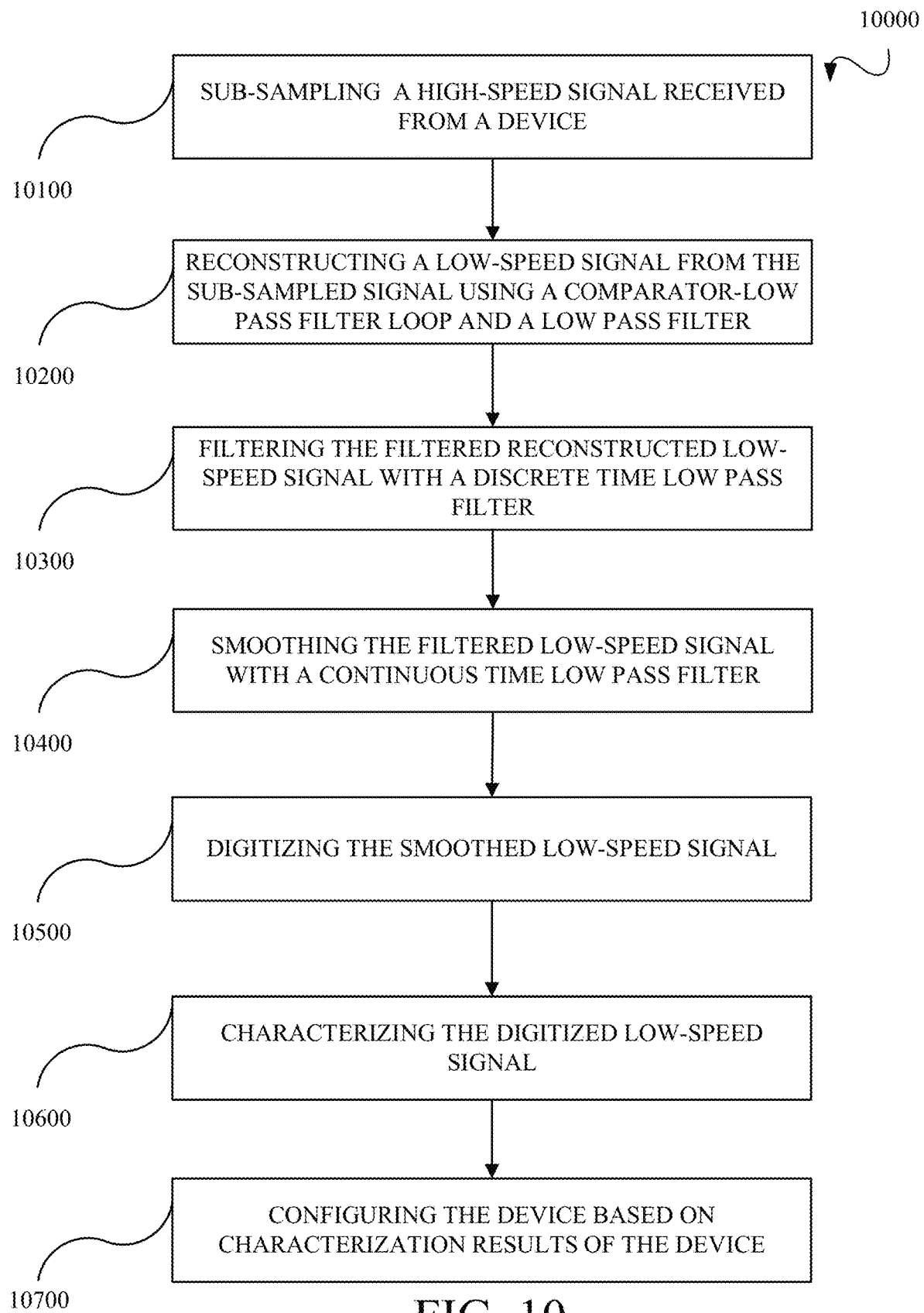
FIG. 10 is a flowchart of an example technique for a low speed characterization of a high-speed signal in accordance with embodiments of this disclosure.

FIG. 10 is a flowchart of an example method 10000 for low speed characterization of a high-speed signal in accordance with embodiments of this disclosure. The method 10000 includes: sub-sampling 10100 a high-speed signal received from a device; reconstructing 10200 a low-speed signal from the sub-sampled signal using a comparator-low pass filter loop and a low pass filter; filtering 10300 the filtered reconstructed low-speed signal with a discrete time low pass filter; smoothing 10400 the filtered low-speed signal with a continuous time low pass filter; digitizing 10500 the smoothed low-speed signal; characterizing 10600 the digitized low-speed signal; and configuring 10700 the device based on characterization results of the device. The method 10000 can be implemented by the low speed device 1000 of FIG. 1, the digitizer 2000 of FIG. 2, the digitizer 3000 of FIG. 3, the low speed circuit 4000 of FIG. 4, the digitizer 8000 of FIG. 8, and the differential digitizer 9000 of FIG. 9, as appropriate and applicable.

The method 10000 includes sub-sampling 10100 a high-speed signal received from a device. A high-speed signal is sub-sampled or down-sampled by a defined factor to a low-speed signal. In implementations, the defined factor is a factor or 10, 20, or the like. In implementations, the high-speed signal is an analog signal. In implementations, a sub-sampling circuit can be a differential circuit. In implementations, the device is a high-speed DAC.

The method 10000 includes reconstructing 10200 a low-speed signal from the sub-sampled signal using a comparator-low pass filter loop and a low pass filter. The sub-sampled signal is fed to a comparator which compares the sub-sampled signal against a low pass filtered output signal to generate an output signal. The output signal is then fed to a second low pass filter. The first low pass filter in the comparator-low pass filter loop and the second low pass filter are similar. In implementations, the first low pass filter in the comparator-low pass filter loop and the second low pass filter are substantially similar. In implementations, the first low pass filter and the second low pass filter can be analog filters, digital filters, or combinations thereof. In implementations, the first low pass filter and the second low pass filter can be a counter. In implementations, the first low pass filter and the second low pass filter can be differential circuits.

The method 10000 includes filtering 10300 the filtered reconstructed low-speed signal with a discrete time low pass filter. The filtered reconstructed low-speed signal imposes stringent skew rate requirements on later devices or circuits such as a digitizer. Mitigation of this requirement is achieved by passing the filtered reconstructed low-speed signal through a discrete time low pass filter. In implementations, the discrete time low pass filter can be a switched capacitor low pass filter. In implementations, the discrete time low pass filter can be a first order filter, a second order filter, or the like. In implementations, the discrete time low pass filter can be a differential circuit.

The method 10000 includes smoothing 10400 the filtered low-speed signal with a continuous time low pass filter. In implementations, the continuous time low pass filter can be a first order filter, a second order filter, or the like. In implementations, the continuous time low pass filter can have a cascaded operational amplifier configuration. In implementations, the continuous time low pass filter can be a differential circuit.

The method 10000 includes digitizing 10500 the smoothed low-speed signal. In implementations, the digitizer can be a first order circuit, a second order circuit, or the like. In implementations, the digitizer can be a sigma delta analog-to-digital converter (ADC). In implementations, the digitizer can be a frequency to digital converter (FDC). In implementations, the digitizer can be a differential digitizer circuit. In implementations, the digitizer can be a first order filter, a second order filter, or the like.

The method 10000 includes characterizing 10600 the digitized low-speed signal. The digitized low-speed signal can be fed to a characterization device. In implementations, the characterization device can be an on-chip processor, an on-chip digital signal processor, or the like. In implementations, the characterization device can be an external or off-chip computing device or the like. In implementations, the characterization can be done in real-time.

The method 10000 includes configuring 10700 the device based on characterization results of the device. The results of the characterization are used to configure the device providing the high-speed signal.

Figure 11:
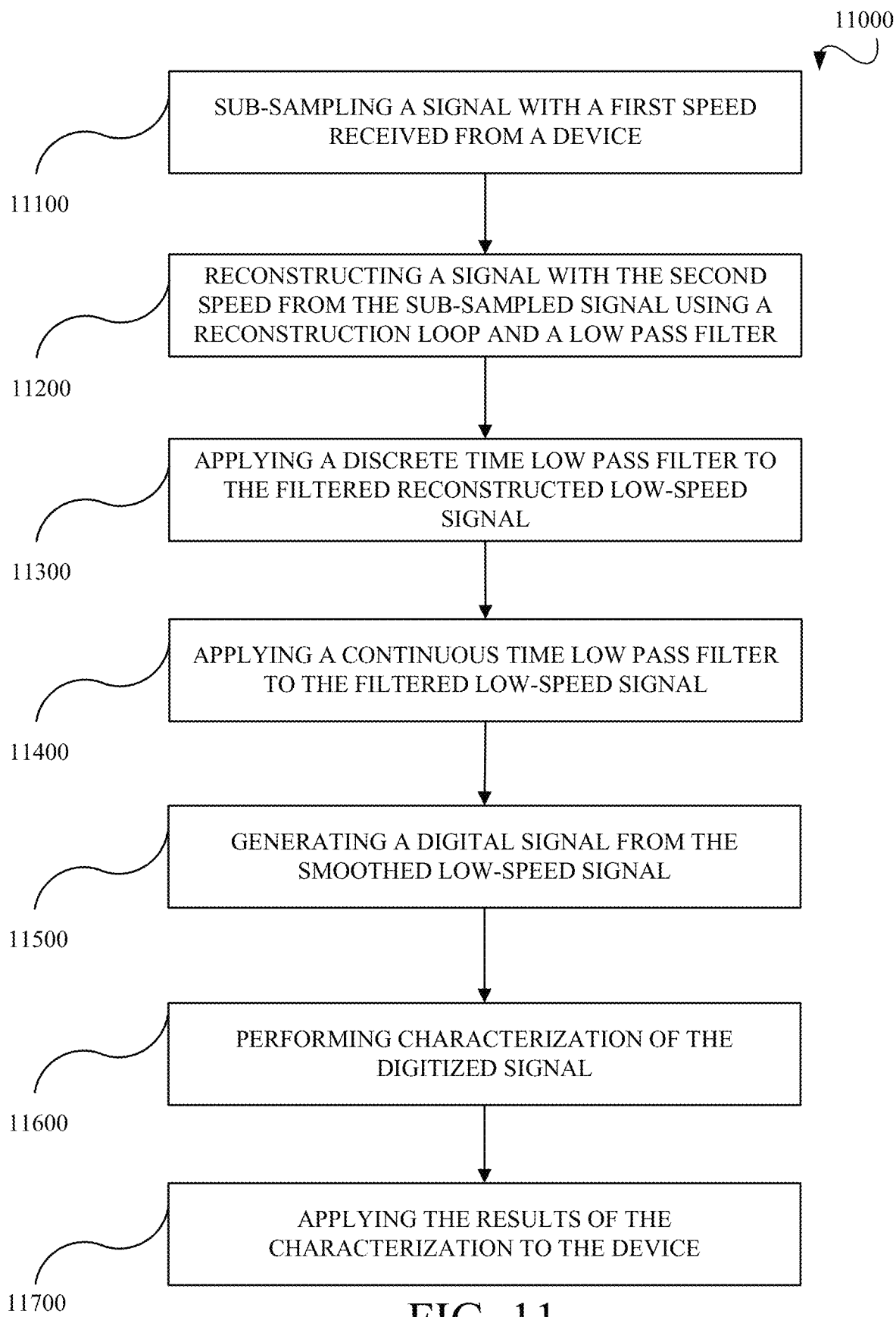
FIG. 11 is a flowchart of an example technique for a low speed characterization of a high-speed signal in accordance with embodiments of this disclosure.

FIG. 11 is a flowchart of an example method 11000 for characterization of a signal at less than an originating speed in accordance with embodiments of this disclosure. The method 11000 includes: sub-sampling 11100 a signal with a first speed received from a device; reconstructing 11200 a signal with the second speed from the sub-sampled signal using a reconstruction loop and a low pass filter; applying 11300 a discrete time low pass filter to the filtered reconstructed low-speed signal; applying 11400 a continuous time low pass filter to the filtered low-speed signal; generating 11500 a digital signal from the smoothed low-speed signal; performing 11600 characterization of the digitized signal; and applying 11700 the results of the characterization to the device. The method 11000 can be implemented by the low speed device 1000 of FIG. 1, the digitizer 2000 of FIG. 2, the digitizer 3000 of FIG. 3, the low speed circuit 4000 of FIG. 4, the digitizer 8000 of FIG. 8, and the differential digitizer 9000 of FIG. 9, as appropriate and applicable.

The method 11000 includes sub-sampling 11100 a signal with a first speed received from a device. A signal with the first speed is sub-sampled or down-sampled by a defined factor to a signal with a second speed which is lower than the first speed. In implementations, the defined factor is a factor or 10, 20, or the like. In implementations, the signal is an analog signal. In implementations, a sub-sampling circuit can be a differential circuit. In implementations, the device is a high-speed DAC.

The method 11000 includes reconstructing 11200 a signal with the second speed from the sub-sampled signal using a reconstruction loop and a low pass filter. The sub-sampled signal is fed to a reconstruction loop which includes a low pass filter and a comparator. The comparator compares the sub-sampled signal against an output signal of the reconstruction loop which is filtered through the low pass filter. The output signal is also fed to another low pass filter. The loop low pass filter and the other low pass filter are similar. In implementations, the loop low pass filter and the other low pass filter are substantially similar. In implementations, the loop low pass filter and the other low pass filter can be analog filters, digital filters, or combinations thereof. In implementations, the loop low pass filter and the other low pass filter can be a counter. In implementations, the loop low pass filter and the other low pass filter can be differential circuits.

The method 11000 includes applying 11300 a discrete time low pass filter to the filtered reconstructed low-speed signal. The filtered reconstructed low-speed signal imposes stringent skew rate requirements on later devices or circuits such as a digitizer. Mitigation of this requirement is achieved by passing the filtered reconstructed low-speed signal through a discrete time low pass filter. In implementations, the discrete time low pass filter can be a switched capacitor low pass filter. In implementations, the discrete time low pass filter can be first order filter, a second order filter, or the like. In implementations, the discrete time low pass filter can be a differential circuit.

The method 11000 includes applying 11400 a continuous time low pass filter to the filtered low-speed signal. The continuous time low pass filter smooths the filtered low-speed signal. In implementations, the continuous time low pass filter can be first order filter, a second order filter, or the like. In implementations, the continuous time low pass filter can have a cascaded operational amplifier configuration. In implementations, the continuous time low pass filter can be a differential circuit.

The method 11000 includes generating 11500 a digital signal from the smoothed low-speed signal. In implementations, a digitizer can be a first order circuit, a second order circuit, or the like. In implementations, the digitizer can be a sigma delta analog-to-digital converter (ADC). In implementations, the digitizer can be a frequency to digital converter (FDC). In implementations, the digitizer can be a differential digitizer circuit.

The method 11000 includes performing 11600 characterization of the digitized signal. The digitized low-speed signal can be fed to a characterization device. In implementations, the characterization device can be an on-chip processor, an on-chip digital signal processor, or the like. In implementations, the characterization device can be an external or off-chip computing device or the like. In implementations, the characterization can be done in real-time.

The method 11000 includes applying 11700 the results of the characterization to the device. The results of the characterization are used to configure the device providing the signal with first speed.

In general, a low speed circuit for high-speed signal characterization, the circuit including a sub-sampling circuit configured to sub-sample a high-speed signal received from a device, a reconstruction loop circuit configured to reconstruct a low-speed signal from the sub-sampled high-speed signal, a low pass filter configured to filter the reconstructed low-speed signal, a discrete time low pass filter configured to mitigate skew rate requirements of the filtered low-speed signal for a digitization circuit, a continuous time low pass filter configured to smooth the skew rate mitigated low-speed signal, and the digitization circuit is configured to generate a digital representation of the smoothed low-speed signal for characterization by a characterization device, and shape a noise associated with the smoothed low-speed signal outside a frequency range of interest of the smoothed low-speed signal. In implementations, the reconstruction loop circuit further including a comparator, and a loop low pass filter in a feedback path of the reconstruction loop, where the loop low pass filter and the low pass filter are similar. In implementations, the discrete time low pass filter is a switched capacitor circuit. In implementations, the digitization circuit is a sigma delta analog-to-digital converter. In implementations, the digitization circuit is a frequency to digital converter. In implementations, the characterization device is on-chip with respect to the low speed circuit. In implementations, the characterization device is off-chip with respect to the low speed circuit. In implementations, the sub-sampling circuit, the reconstruction loop, the discrete time low pass filter, the continuous time low pass filter, and the digitization circuit are differential circuits. In implementations, the digitization circuit, the discrete time low pass filter and the continuous time low pass filter are multiple order circuits.

In general, a low speed system for high-speed signal characterization, the system including a low speed circuit and a characterization device. The low speed circuit including a sub-sampler configured to down-sample a signal with a first speed received from a device, a reconstruction circuit configured to reconstruct a signal with a second speed from the sub-sampled signal, where the second speed is a defined factor lower than the first speed, a low pass filter configured to filter the reconstructed signal, a discrete time filter configured to allay skew rate requirements for a digitizer, the digitizer is configured to digitize a filtered signal, and noise-shape noise outside of a frequency range of interest of the filtered signal. The characterization device configured to characterize the digitized signal from the low speed circuit, and configure the device based on characterization results. In implementations, the low speed circuit further including a continuous time low pass filter configured to smooth the filtered signal prior to digitization. In implementations, the reconstruction circuit further including a comparator, and a loop low pass filter in a feedback path of the reconstruction circuit, where the loop low pass filter and the low pass filter are substantially similar. In implementations, the discrete time low pass filter is a switched capacitor circuit and the digitization circuit is one of a sigma delta analog-to-digital converter or a frequency to digital converter. In implementations, the low speed circuit and the characterization device are on-chip with respect to each other. In implementations, the characterization device is performed in real-time. In implementations, the low speed circuit is a differential circuit. In implementations, certain circuits of the low speed circuit are multiple order circuits.

In general, a method for low speed characterization of a high-speed signal, the method including sub-sampling a high-speed signal received from a device, reconstructing a low-speed signal from the sub-sampled signal using a comparator-low pass filter loop and a low pass filter, filtering the filtered reconstructed low-speed signal with a discrete time low pass filter to alleviate skew rate considerations, smoothing the filtered low-speed signal with a continuous time low pass filter, digitizing the smoothed low-speed signal, wherein noise is noise-shaped outside a frequency range of interest, characterizing the digitized low-speed signal, and configuring the device based on characterization results of the device. In implementations, the sub-sampling, the reconstructing, the filtering, the smoothing, and the digitizing are done differentially. In implementations, the sub-sampling, the reconstructing, the filtering, the smoothing, the digitizing, the characterizing, and the configuring are done on on-chip.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A low speed circuit for high-speed signal characterization, the circuit comprising:
   a sub-sampling circuit configured to sub-sample a high-speed signal received from a device;
   a reconstruction loop circuit configured to reconstruct a low-speed signal from the sub-sampled high-speed signal;
   a low pass filter configured to filter the reconstructed low-speed signal;
   a discrete time low pass filter configured to mitigate skew rate requirements of the filtered low-speed signal for a digitization circuit;
   a continuous time low pass filter configured to smooth the skew rate mitigated low-speed signal; and
   the digitization circuit is configured to generate a digital representation of the smoothed low-speed signal for characterization by a characterization device and shape a noise associated with the smoothed low-speed signal outside a frequency range of interest of the smoothed low-speed signal, wherein the characterization determines an effective number of bits of the high-speed signal.

2. The circuit of claim 1, wherein the reconstruction loop circuit further comprises a comparator and a loop low pass filter in a feedback path of the reconstruction loop circuit, wherein the loop low pass filter and the low pass filter are similar in terms of at least low frequencies passed by the loop low pass filter and the low pass filter.

3. The circuit of claim 1, wherein the discrete time low pass filter is a switched capacitor circuit.

4. The circuit of claim 1, wherein the digitization circuit is a sigma delta analog-to-digital converter.

5. The circuit of claim 1, wherein the digitization circuit is a frequency to digital converter.

6. The circuit of claim 1, wherein the characterization device is on-chip with respect to the low speed circuit.

7. The circuit of claim 1, wherein the characterization device is off-chip with respect to the low speed circuit.

8. The circuit of claim 7, wherein the digitization circuit, the discrete time low pass filter and the continuous time low pass filter are multiple order circuits.

9. The circuit of claim 1, wherein the sub-sampling circuit, the reconstruction loop circuit, the discrete time low pass filter, the continuous time low pass filter, and the digitization circuit are differential circuits.

10. A low speed system for high-speed signal characterization, the system comprising:
    a low speed circuit comprising
        a sub-sampler configured to down-sample a signal with a first speed received from a device;
        a reconstruction circuit configured to reconstruct a signal with a second speed from the sub-sampled signal, wherein the second speed is a defined factor lower than the first speed;
        a low pass filter configured to filter the reconstructed signal;
        a discrete time filter configured to allay skew rate requirements for a digitizer;
        the digitizer is configured to digitize a filtered signal and noise-shape noise outside of a frequency range of interest of the filtered signal; and
    a characterization device configured to characterize the digitized signal from the low speed circuit and configure the device based on characterization results, wherein the characterization determines an effective number of bits of the high-speed signal.

11. The system of claim 10, the low speed circuit further comprises a continuous time low pass filter configured to smooth the filtered signal prior to digitization.

12. The system of claim 10, wherein the reconstruction circuit further comprises a comparator and a loop low pass filter in a feedback path of the reconstruction circuit, wherein the loop low pass filter and the low pass filter are substantially similar in terms of at least a cut-off frequency.

13. The system of claim 10, wherein the discrete time low pass filter is a switched capacitor circuit and the digitization circuit is one of a sigma delta analog-to-digital converter or a frequency to digital converter.

14. The circuit of claim 10, wherein the low speed circuit and the characterization device are on-chip.

15. The circuit of claim 10, wherein the characterization is performed in real-time.

16. The circuit of claim 10, wherein the low speed circuit is a differential circuit.

17. The circuit of claim 10, wherein certain circuits of the low speed circuit are multiple order circuits.

18. A method for low speed characterization of a high-speed signal, the method comprising:
    sub-sampling a high-speed signal received from a device;
    reconstructing a low-speed signal from the sub-sampled signal using a comparator-low pass filter loop and a low pass filter;
    filtering the filtered reconstructed low-speed signal with a discrete time low pass filter to alleviate skew rate considerations;
    smoothing the filtered low-speed signal with a continuous time low pass filter;
    digitizing the smoothed low-speed signal, wherein noise is noise-shaped outside a frequency range of interest;
    characterizing the digitized low-speed signal; and
    configuring the device based on characterization results of the device, wherein the characterization determines an effective number of bits of the high-speed signal.

19. The method of claim 18, wherein the sub-sampling, the reconstructing, the filtering, the smoothing, and the digitizing are done differentially.

20. The method of claim 18, wherein the sub-sampling, the reconstructing, the filtering, the smoothing, the digitizing, the characterizing, and the configuring are done on on-chip.

* * * * *